(12) United States Patent
Lue et al.

(10) Patent No.: US 11,430,527 B1
(45) Date of Patent: Aug. 30, 2022

(54) METHOD FOR PERFORMING OPERATION IN MEMORY DEVICE

(71) Applicant: MACRONIX INTERNATIONAL CO., LTD., Hsinchu (TW)

(72) Inventors: Hang-Ting Lue, Hsinchu (TW); Tzu-Hsuan Hsu, Chiayi County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/233,590

(22) Filed: Apr. 19, 2021

(51) Int. Cl.
| | |
|---|---|
| *G11C 16/34* | (2006.01) |
| *G11C 16/14* | (2006.01) |
| *G11C 16/10* | (2006.01) |
| *G11C 16/32* | (2006.01) |
| *G11C 16/08* | (2006.01) |
| *G11C 16/30* | (2006.01) |
| *G11C 16/26* | (2006.01) |

(52) U.S. Cl.
CPC .......... *G11C 16/3409* (2013.01); *G11C 16/08* (2013.01); *G11C 16/102* (2013.01); *G11C 16/14* (2013.01); *G11C 16/26* (2013.01); *G11C 16/30* (2013.01); *G11C 16/32* (2013.01)

(58) Field of Classification Search
None
See application file for complete search history.

(56) References Cited

U.S. PATENT DOCUMENTS

| | | | |
|---|---|---|---|
| 2018/0005700 A1* | 1/2018 | Kang | G11C 11/5635 |
| 2019/0115081 A1* | 4/2019 | Lee | G11C 16/24 |
| 2020/0381450 A1 | 12/2020 | Lue et al. | |
| 2021/0005265 A1* | 1/2021 | Lee | G11C 16/08 |

* cited by examiner

*Primary Examiner* — Tan T. Nguyen
(74) *Attorney, Agent, or Firm* — McClure, Qualey & Rodack, LLP

(57) ABSTRACT

A method for performing an operation in a memory device is provided. The method includes the following steps. An erasing operation is performed on one selected word line of the memory device to ensure that a plurality of first cells to be programed and a plurality of second cells to be erased connected to the selected word line have threshold voltages lower than a first predetermined level. A programming operation is performed on the selected word line, such that the first cells are suffered a first program bias and the second cells are suffered a second program bias which is lower than the first program bias.

20 Claims, 11 Drawing Sheets

METHOD FOR PERFORMING OPERATION IN MEMORY DEVICE

TECHNICAL FIELD

The disclosure relates in general to a method for performing an operation, and more particularly to a method for performing an operation in a memory device.

BACKGROUND

Along with the development of the memory technology, Flash memory is widely used in electronic devices. The Flash memory is an electronic non-volatile memory that can be electrically erased and reprogrammed.

Usually, the program unit of the flash, such as one page of 256 Bytes, is much smaller than the erase unit of the flash, such as one block of 4K Bytes. The erase time is usually very long, for example 25 milliseconds (ms). Thus, to write a page, we need to wait for a long erase time (>25 milliseconds (ms)) before programing. This affects the write latency performances.

SUMMARY

The disclosure is directed to a method for performing an operation in a memory device. During the Write-in-Place operation, only one page is needed to be erased and the same page can be programed. The user does not need to erase a block, and the write latency performance can be greatly improved.

According to one embodiment, a method for performing an operation in a memory device is provided. The method includes the following steps. An erasing operation is performed on one selected word line of the memory device to ensure that a plurality of first cells to be programed and a plurality of second cells to be erased connected to the selected word line have threshold voltages lower than a first predetermined level. A programming operation is performed on the selected word line, such that the first cells are suffered a first program bias and the second cells are suffered a second program bias which is lower than the first program bias.

Figure 1:
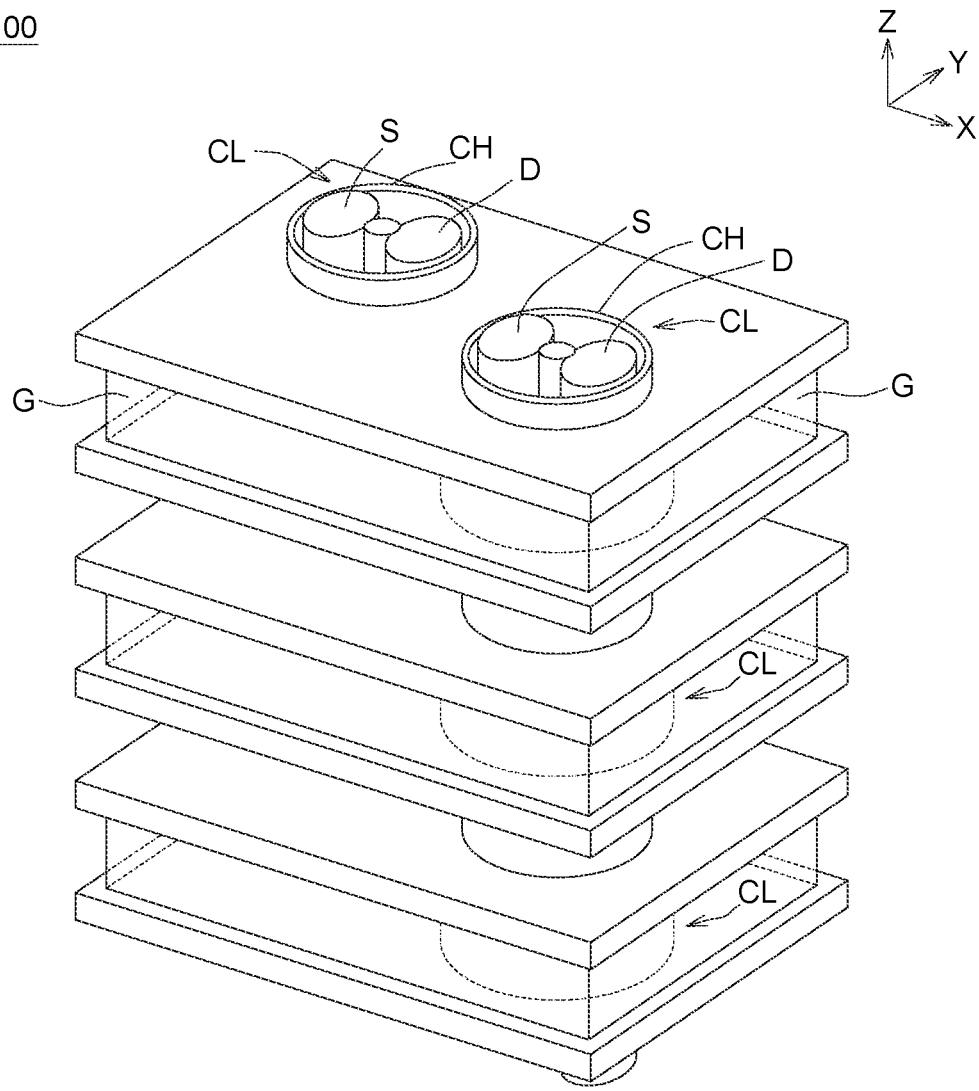
FIG. 1 shows a memory device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Refer to FIG. 1, which shows a memory device 100 according to one embodiment. The memory device 100 is, for example, a 3D AND memory. The structure of the memory device 100 is not used to limit the present invention. The memory device 100 includes a plurality cells CL which are stacked along the Z axis direction. Each of the cells CL includes a gate G, a source S, a drain D and a channel CH. The sources S and the drains D may be formed by N type diffusion polysilicon plugs. The channels CH may be formed by ONO structure, ONONO structure, SONOS structure, BE-SONOS structure or BE-MANOS structure.

Figure 2:
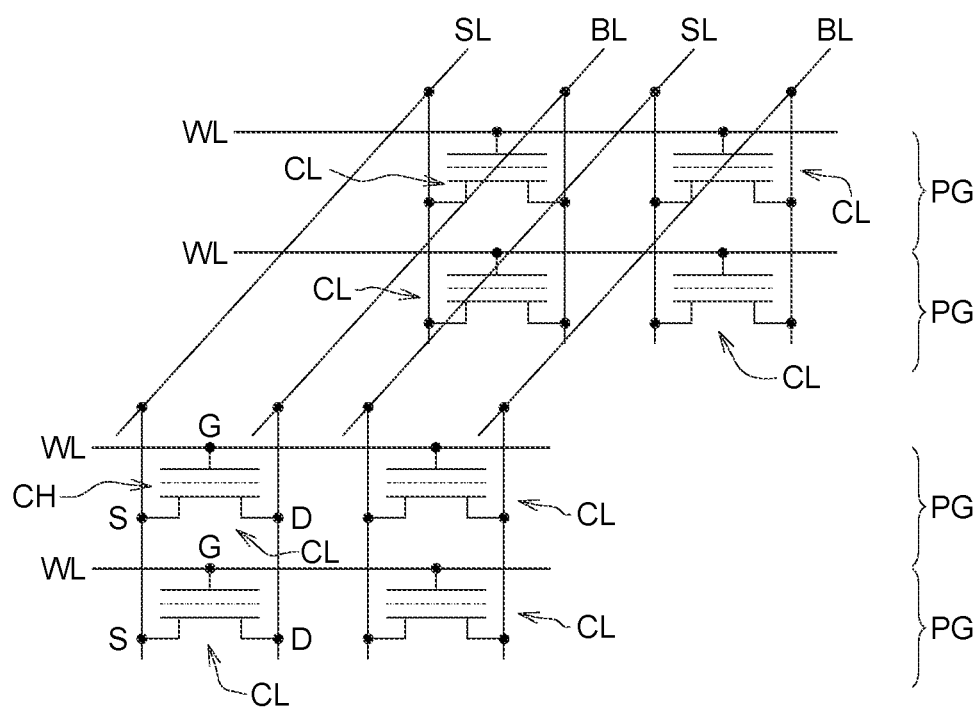
FIG. 2 shows a circuit diagram of the memory device.

Refer to FIG. 2, which shows a circuit diagram of the memory device 100. The cells CL connected to one word line WL form one page PG. The size of the page PG is, for example, 256 Bytes. The cells CL stacked vertically are connected to a bit line BL and a source line SL. The gate G of the cell CL is connected to the word line WL, the drain D of the cell CL is connected to the bit line BL, and the source S of the cell CL is connected to the source line SL.

Figure 3:
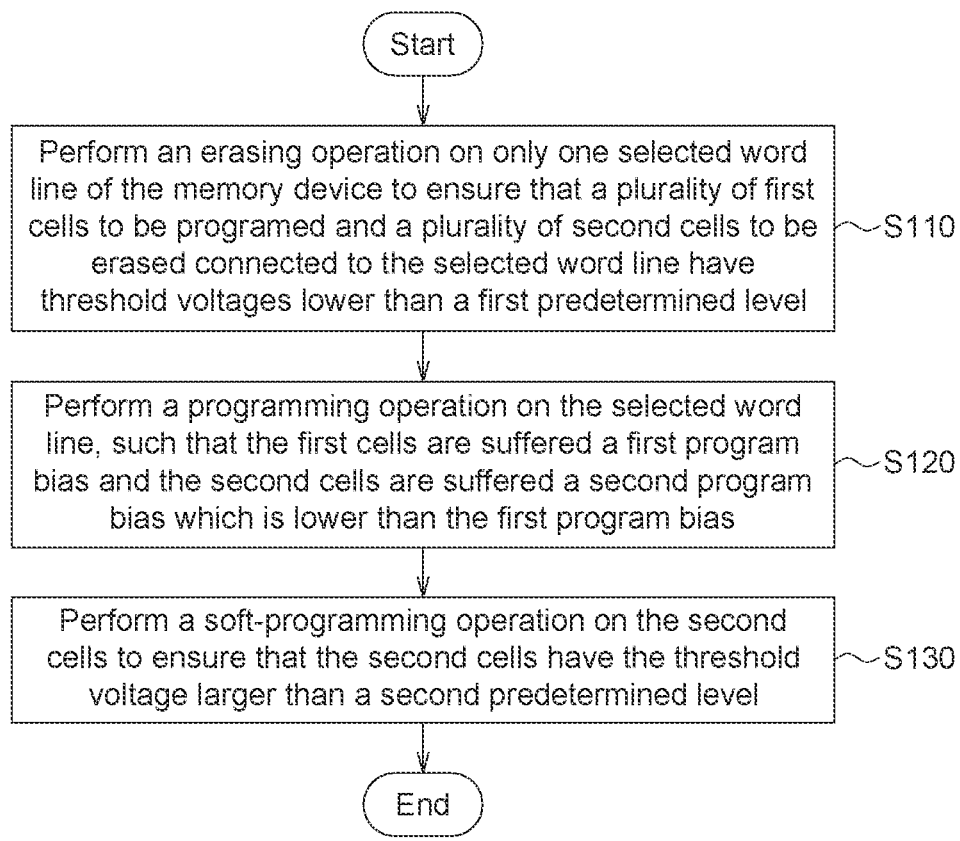
FIG. 3 shows a flowchart of the method for performing an operation in the memory device according to one embodiment.

In the present disclosure, a method for performing an operation in the memory device 100 is provided. The operation is, for example, a Write-in-Place. In the Write-in-Place, one page PG can be erased and the same page PG can be programed. Please refer to FIG. 3, which shows a flowchart of the method for performing an operation in the memory device 100 according to one embodiment. The operation is, for example, a Write-in-Place. In the example of FIG. 3, the method for performing the Write-in-Place operation in the memory device 100 includes steps S110 to S130. In another embodiment, the method for performing the Write-in-Place operation in the memory device 100 may include the step S110 and S120 only.

Figure 4A:
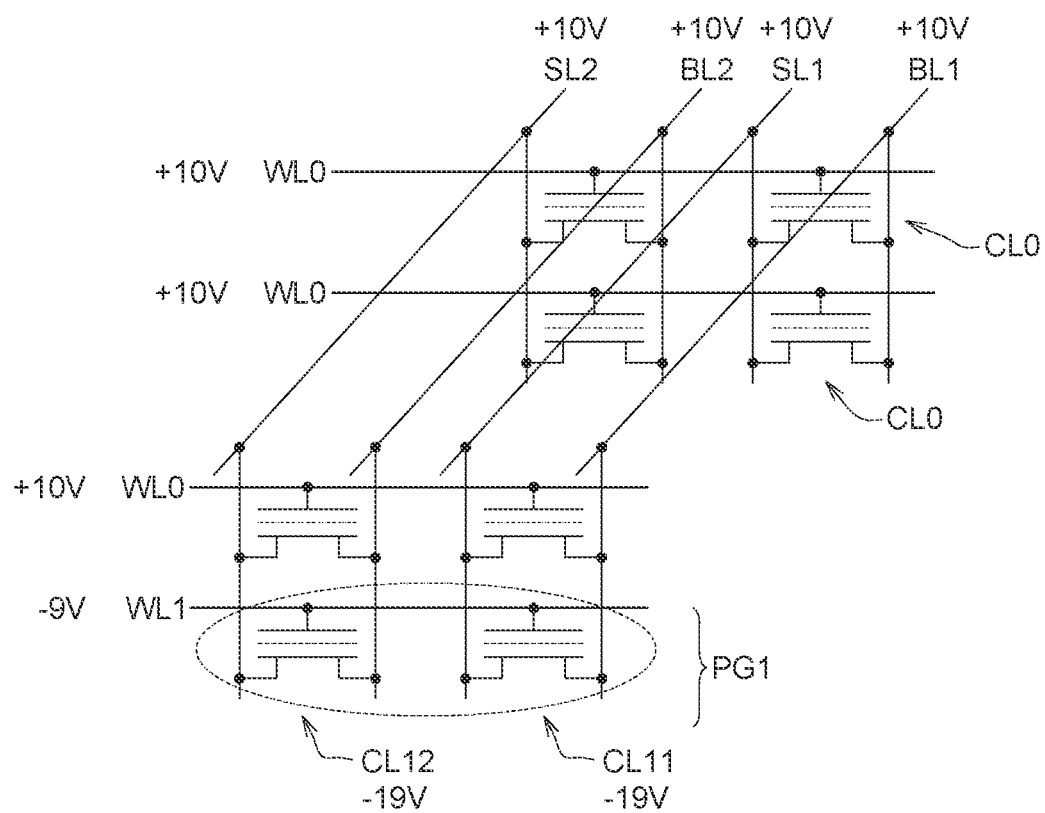
FIG. 4A illustrates a voltage control in the step S110 of FIG. 3.

Refer to FIG. 4A, which illustrates a voltage control in the step S110 of FIG. 3 according to one embodiment. In the step S110, an erasing operation is performed on only one selected word line WL1 of the memory device 100. The step S110 of performing the erasing operation on the selected word line WL1 is performed form 100 microseconds (µs) to 1 milliseconds (ms). A plurality of first cells CL11 to be programmed and a plurality of second cells CL12 to be erased connected to the selected word line WL1 form a page PG1. Each of the first cells CL1 to be programmed is connected to a first bit line BL1 and a first source line SL1. Each of the second cells CL2 to be erased is connected to a second bit line BL2 and a second source line SL2. A plurality of de-selected word lines WL0 are not performed the erasing operation.

In this step, an identical voltage of +10V, is applied to the first bit lines BL1, the first source lines SL1, the second bit lines BL2 and the second source lines SL2. A negative voltage of −9V is applied to the selected word line WL1, and a positive voltage of +10V is applied to the de-selected word lines WL0. Accordingly, the first cells CL11 to be programmed are suffered a first erase bias of −19V and the second cells CL12 to be erased are suffered a second erase bias of −19V. Therefore, the first cells CL11 and the second cells CL12 connected to the selected word line WL1 are erased, the cells CL0 connected to the de-selected word lines WL0 are inhibited.

In another embodiment, erase biases in the step S110 may be set according to the following conditions: (1) The first erase bias suffered on the first cells CL11 to be programmed and the second erase bias suffered on the second cells CL12 to be erased are more negative than an erase threshold voltage. The erase threshold voltage is, for example, −17V. (2) The first erase bias suffered on the first cells CL11 to be programmed and the second erase bias suffered on the second cells CL12 to be erased are substantially the same. For example, the difference between the first erase bias suffered on the first cells CL11 to be programmed and the second erase bias suffered on the second cells CL12 to be erased is lower than 2V. The first erase bias and the second erase bias are, for example, −19V.

Figure 4B:
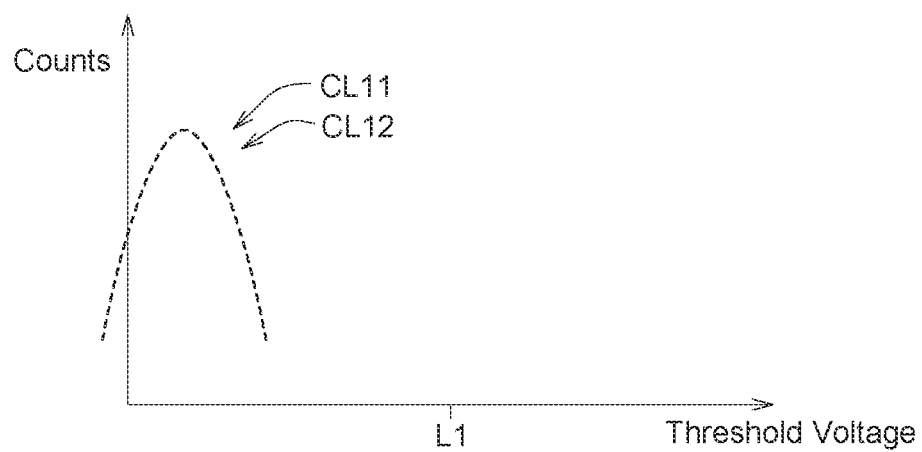
FIG. 4B illustrates a threshold voltage distribution in the step S110 of FIG. 3.

Refer to FIG. 4B, which illustrates a threshold voltage distribution in the step S110 of FIG. 3 according to one embodiment. After the erasing operation is performed on the selected word line WL1, all of the first cells CL11 to be programed and the second cells CL12 to be erased connected to the selected word line WL1 have threshold voltages lower than a first predetermined level 1.

Figure 5A:
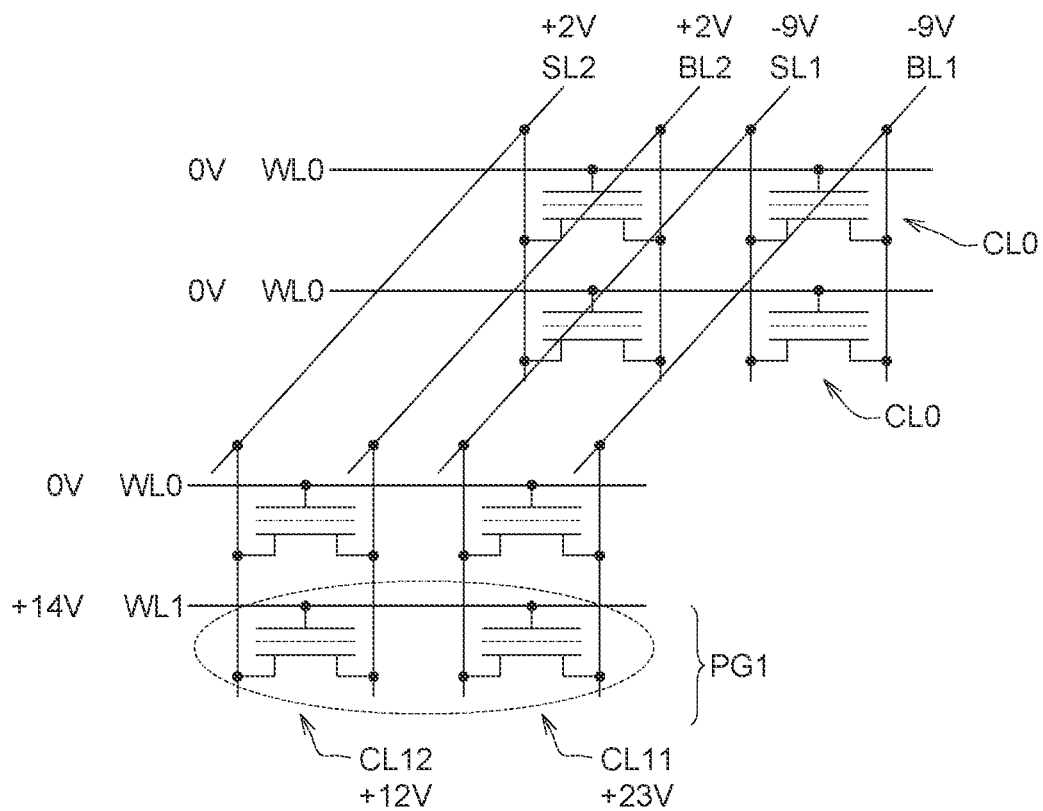
FIG. 5A illustrates a voltage control in the step S120 of FIG. 3.

Next, refer to FIG. 5A, which illustrates a voltage control in the step S120 of FIG. 3 according to one embodiment. In the step S120, a programming operation with a checkerboard pattern is performed on the selected word line WL1. The step S120 of performing the programming operation on the selected word line WL is performed by one shot for 10 microseconds (μs). A voltage of +14V is applied to the selected word line WL1, and a voltage of 0V is applied to the de-selected word lines WL0. A negative voltage of −9V is applied to the first bit lines BL1 and the first source lines SL1, a positive voltage of +2V is applied to the second bit lines BL2 and the second source lines SL2. Therefore, the first cells CL11 are suffered a first program bias of +23V and the second cells CL12 are suffered a second program bias of +12V. The second program bias is lower than the first program bias.

In another embodiment, program biases in the step S120 may be set according to the following conditions: (1) The first program bias suffered on the first cells CL11 to be programmed is larger than a program threshold voltage. The program threshold voltage is, for example, +20V, and the first program bias is, for example, +23V. (2) The second program bias suffered on the first cells CL12 to be erased is lower than the program threshold voltage. The second program bias, is for example, +12V. (3) A third program bias suffered on the cells CL0 connected to the de-selected word lines is much lower than the program threshold voltage. The third program bias is, for example, +9V to −2V.

Figure 5B:
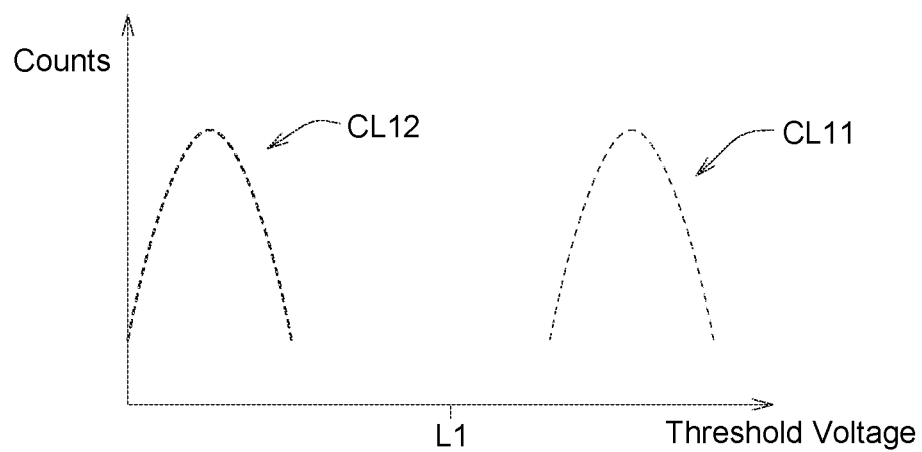
FIG. 5B illustrates a threshold voltage distribution in the step S120 of FIG. 3.

Refer to FIG. 5B, which illustrates a threshold voltage distribution in the step S120 of FIG. 3 according to one embodiment. After the programming operation with the checkerboard pattern is performed on the selected word line WL1, the threshold voltage of the first cells CL11 to be programmed is larger than that of the second cells CL12 to be erased.

Comparing with the FIG. 4B, the distribution of threshold voltage of the second cells CL12 in FIG. 5B shifts to the right due to the program disturbing and interference.

Figure 6A:
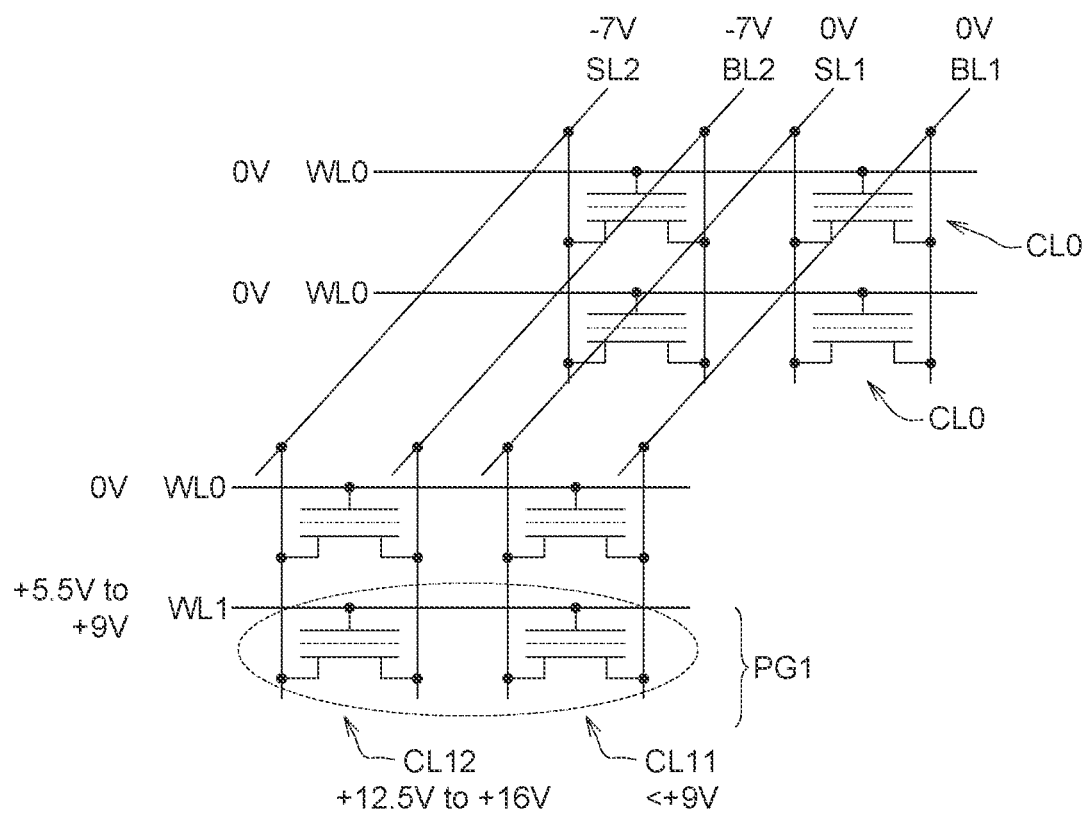
FIG. 6A illustrates a voltage control in the step S130 of FIG. 3.

Afterwards, refer to FIG. 6A, which illustrates a voltage control in the step S130 of FIG. 3 according to one embodiment. In the step S130, a soft-programming operation is performed on the second cells CL12. In the soft-programming operation, an Incremental Step Pulse Programming (ISPP) voltage of +5.5V to +9V is applied to the selected word line WL1, and a voltage of 0V is applied to the de-selected word lines WL0. The second cells CL12 are soft programed by a plurality of shots each of which is for 5 microseconds (μs). The number of shots is lower than or equal to 8. For example, the second cells CL12 may be sequentially programmed by eight shots which are +5.5V, +6V, +6.5V, +7V, +7.5V, +8V, +8.5V, +9V.

In another embodiment, ISPP biases in the step S130 may be set according to the following conditions: (1) A first ISPP bias suffered on the first cells CL11 to be programed is much lower than the program threshold voltage. The program threshold voltage is, for example, +20V, and the first ISPP bias is, for example, lower than +9V. (2) A second ISPP bias suffered on the second cells CL12 to be erased is slightly lower than the program threshold voltage. The second ISPP bias is, for example, +12.5V to +16V. (3) A third ISPP bias suffered on the cells CL0 is much lower than the program threshold voltage. For example, the third ISPP bias is, for example, +7V to 0V.

A voltage of 0V is applied to the first bit lines BL1 and the first source lines SL1, a negative voltage of −7V is applied to the second bit lines BL2 and the second source lines SL2. Accordingly, the first cells CL11 to be programmed are suffered a soft program bias less than +9V; the second cells CL12 to be erase are suffered a soft program bias from +12.5V to +16V.

Figure 6B:
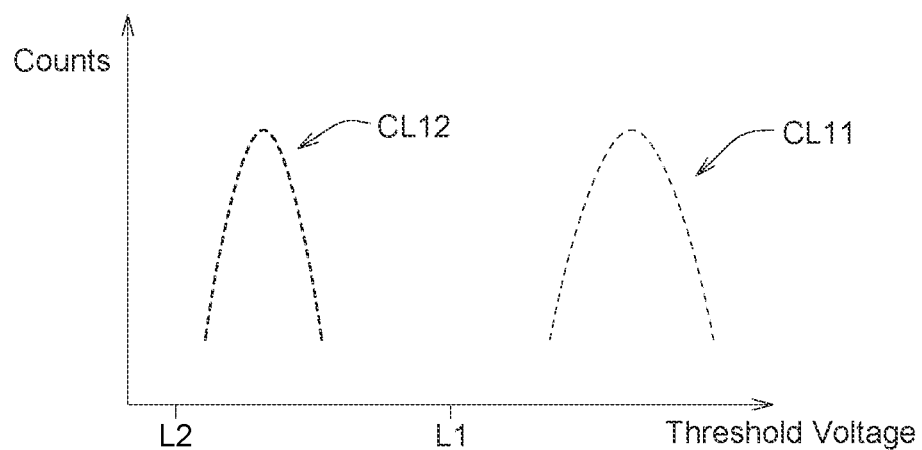
FIG. 6B illustrates a threshold voltage distribution in the step S130 of FIG. 3.

Refer to FIG. 6B, which illustrates a threshold voltage distribution in the step S130 of FIG. 3 according to one embodiment. After the soft-programming operation is performed on the second cells CL12, the second cells CL12 have the threshold voltage larger than a second predetermined level L2. Therefore, the threshold voltage distribution of the second cells CL12 became tighter.

Base on above, the Write-in-Place operation in the memory device 100 can be successfully implemented. Only one page PG1 is needed to be erased and the same page PG1 can be programed. The user does not need to erase a block, and the write latency performance can be improved.

Figure 7:
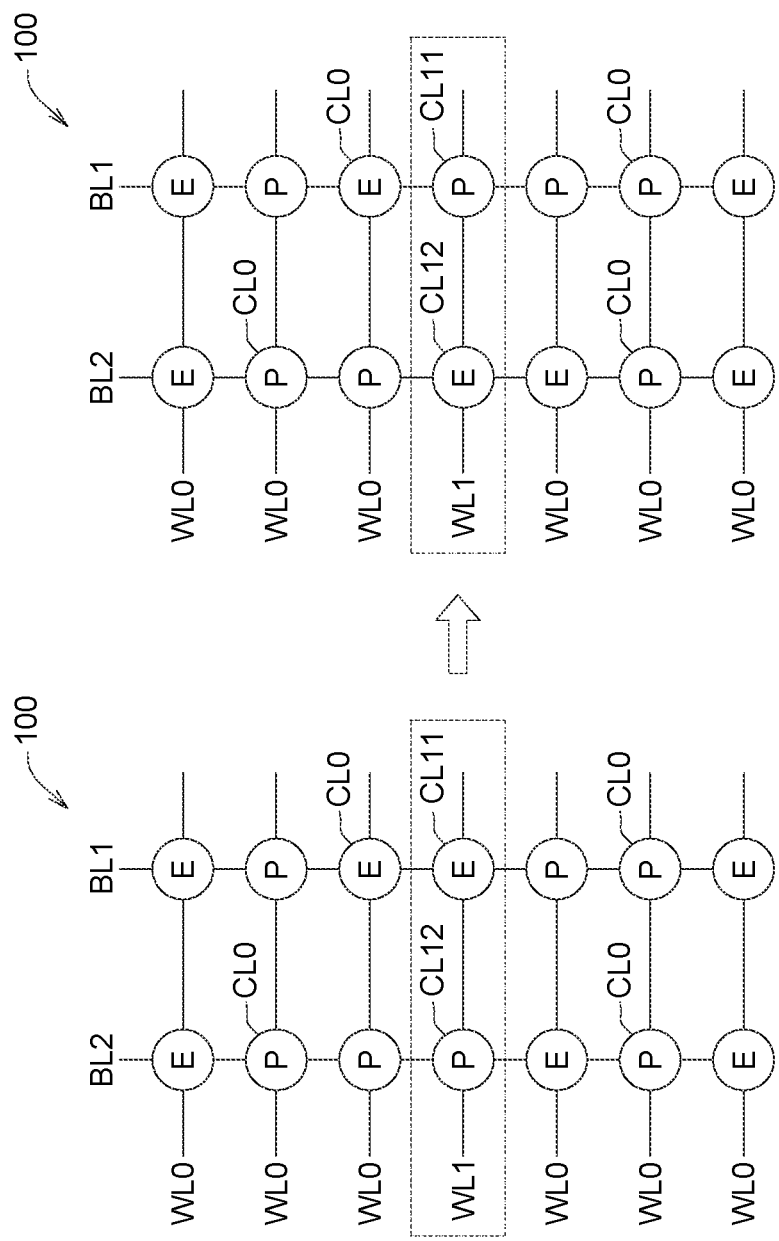
FIG. 7 illustrates the neighbor disturbing during the Write-in-Place operation.

Please, refer to FIG. 7 which illustrates the neighbor disturbing during the Write-in-Place operation. As shown in the left side of FIG. 7, the first cell CL11 is at an erase state E, the second cell CL12 is at a program state P. After performing the Write-in-Place operation, as shown in the right side of FIG. 7, the first cell CL11 is changed to the program state P, and the second cell CL12 is changed to the erase state E. Comparing the left side of FIG. 7 and the right side of FIG. 7, the cells CL0 which are connected to the de-selected word lines WL0 are not changed. That is to say, the Write-in-Place operation performing on the selected word line WL1 does not disturb the neighbor de-selected word lines WL0.

Figure 8:
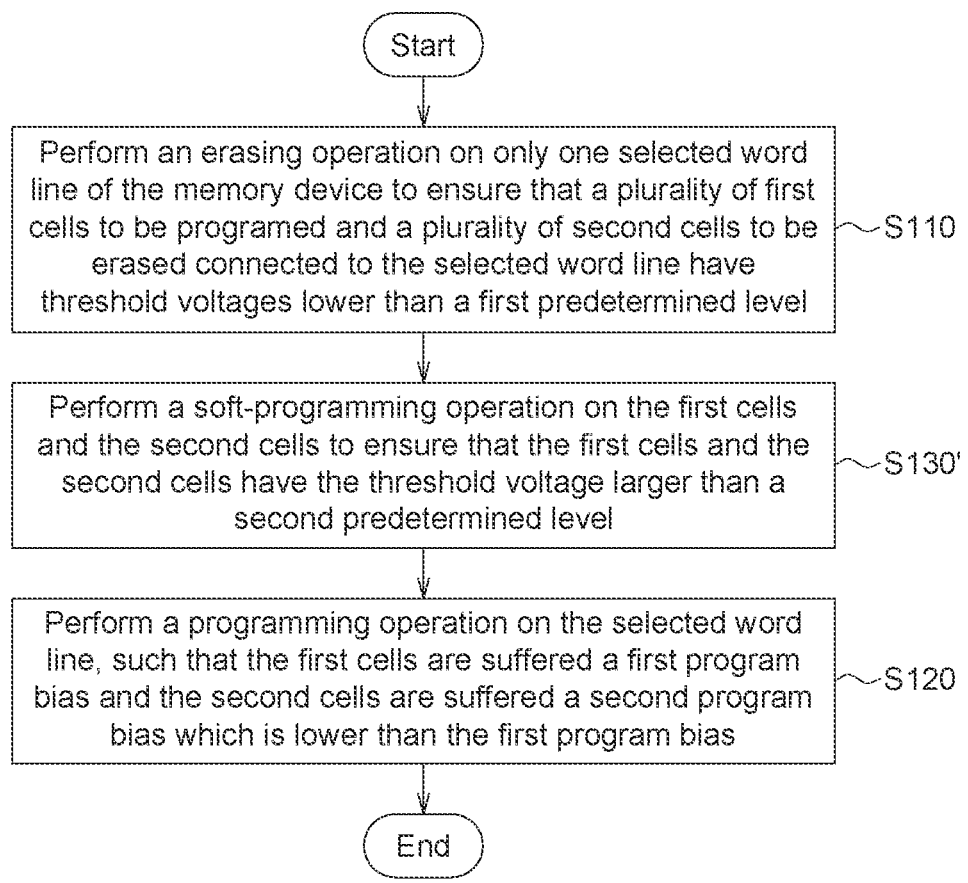
FIG. 8 shows a flowchart of the method for performing an operation in the memory device according to another embodiment.

Please refer to FIG. 8, which shows a flowchart of the method for performing an operation in the memory device 100 according to another embodiment. The operation is, for example, a Write-in-Place. In the example of FIG. 8, the method for performing the Write-in-Place operation in the memory device 100 includes steps S110, S130' and S120. The step S130' is performed before the step S120.

Figure 9A:
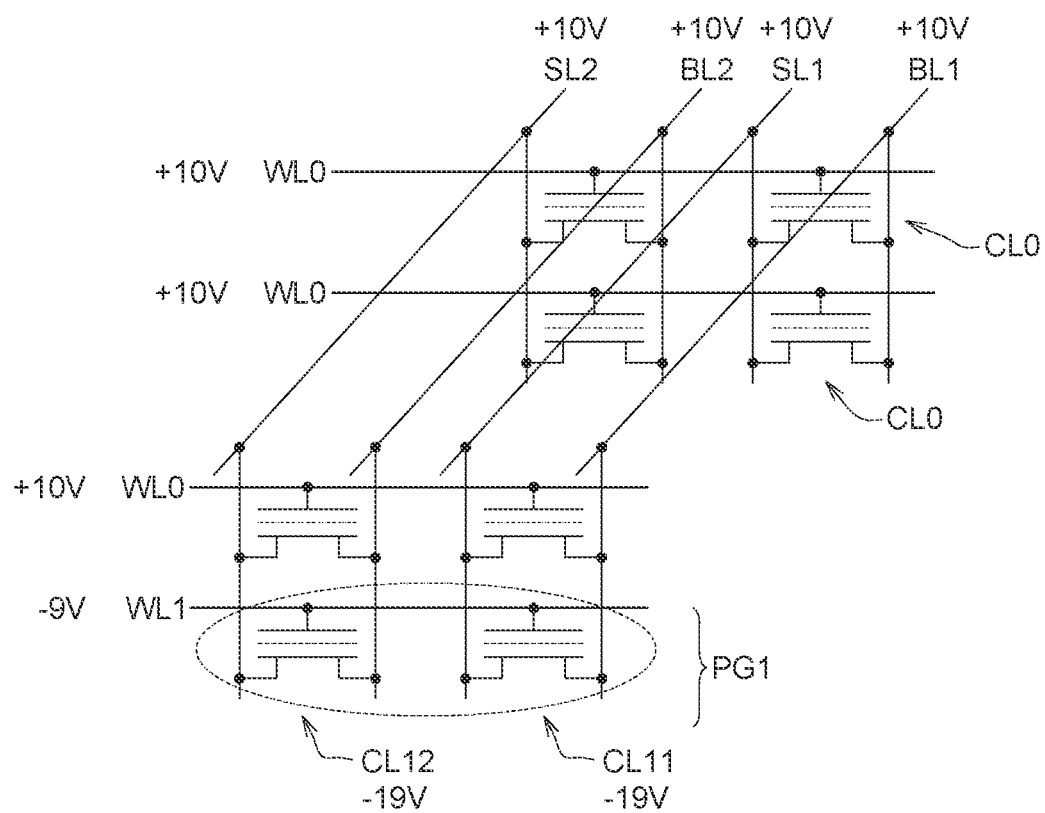
FIG. 9A illustrates a voltage control in the step S110 of FIG. 8.

Refer to FIG. 9A, which illustrates a voltage control in the step S110 of FIG. 8 according to one embodiment. In the step S110, an erasing operation is performed on only one selected word line WL1 of the memory device 100. The step S110 of performing the erasing operation on the selected word line WL1 is performed form 100 microseconds (μs) to 1 milliseconds (ms). A plurality of first cells CL11 to be programmed and a plurality of second cells CL12 to be erased connected to the selected word line WL1 form a page PG1. Each of the first cells CL11 to be programmed is connected to a first bit line BL1 and a first source line SL1. Each of the second cells CL12 to be programmed is connected to a second bit line BL2 and a second source line SL2. A plurality of de-selected word lines WL0 are not performed the erasing operation.

In this step, an identical voltage of +10V, is applied to the first bit lines BL1, the first source lines SL1, the second bit lines BL2 and the second source lines SL2. A negative voltage of −9V is applied to the selected word line WL1, and a positive voltage of +10V is applied to the de-selected word lines WL0. Accordingly, the first cells CL11 to be programmed are suffered a first erase bias of −19V and the second cells CL12 to be erased are suffered a second erase bias of −19V. Therefore, the first cells CL11 and the second cells CL12 connected to the selected word line WL1 are erased, the cells CL0 connected to the de-selected word lines WL0 are inhibited.

In another embodiment, erase biases in the step S110 may be set according to the following conditions: (1) The first erase bias suffered on the first cells CL11 to be programmed and the second erase bias suffered on the second cells CL12 to be erased are larger than an erase threshold voltage. The erase threshold voltage is, for example, −17V. (2) The first erase bias suffered on the first cells CL11 to be programmed and the second erase bias suffered on the second cells CL12 to be erased are substantially the same. For example, the difference between the first erase bias suffered on the first cells CL11 to be programmed and the second erase bias suffered on the second cells CL12 to be erased is lower than 2V. The first erase bias and the second erase bias are, for example, −19V.

Figure 9B:
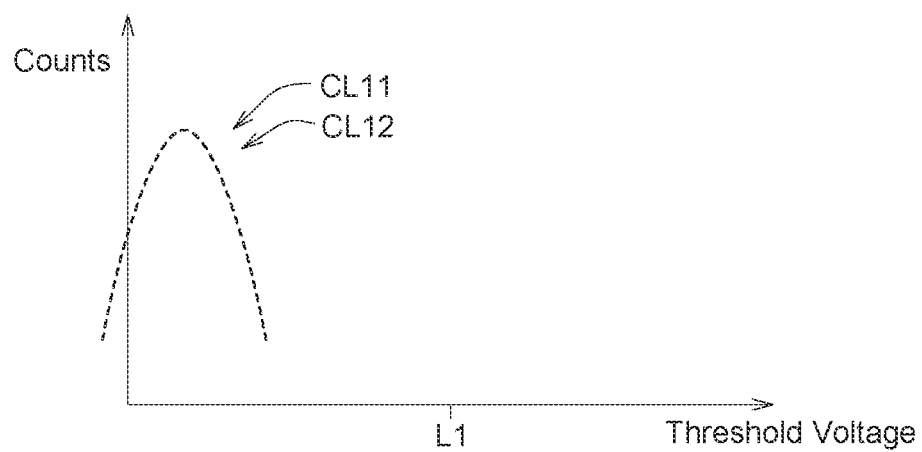
FIG. 9B illustrates a threshold voltage distribution in the step S110 of FIG. 8.

Refer to FIG. 9B, which illustrates a threshold voltage distribution in the step S110 of FIG. 8 according to one embodiment. After the erasing operation is performed on the selected word line WL1, all of the first cells CL11 to be programed and the second cells CL12 to be erased connected to the selected word line WL1 have threshold voltages lower than a first predetermined level 1.

Figure 10A:
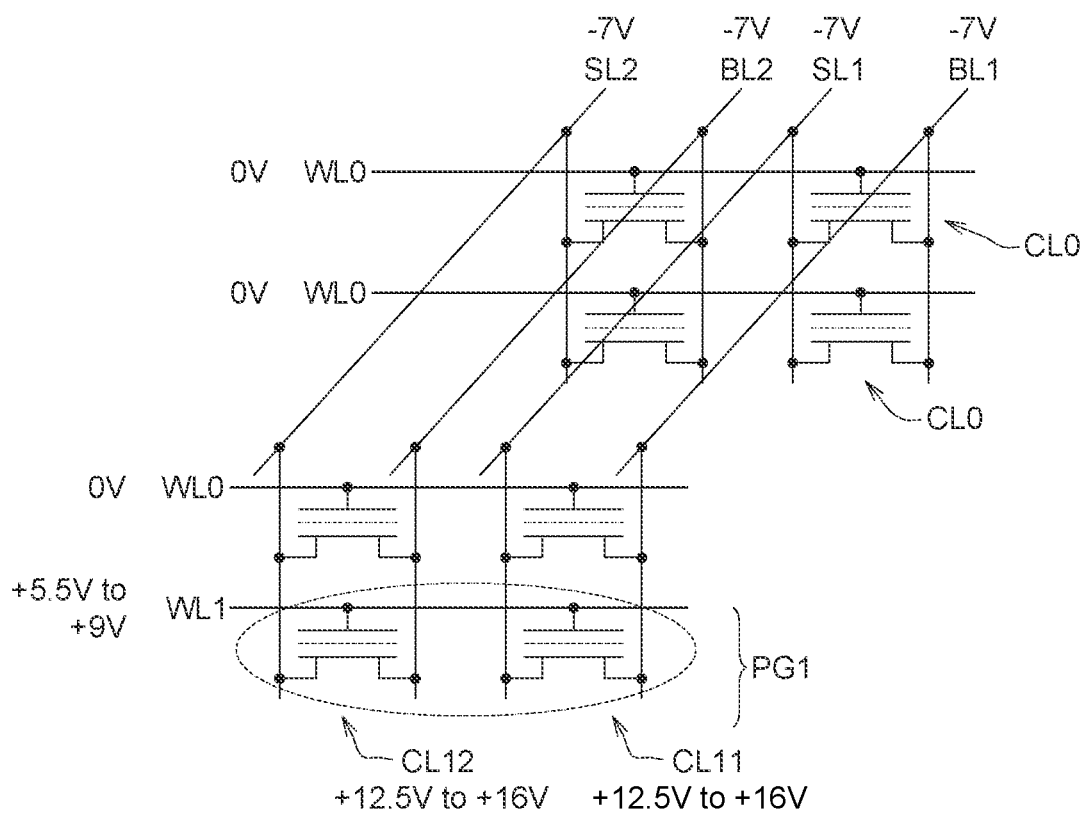
FIG. 10A illustrates a voltage control in the step S130' of FIG. 8.

Afterwards, refer to FIG. 10A, which illustrates a voltage control in the step S130' of FIG. 8 according to one embodiment. In the step S130', a soft-programming operation is performed on the first cells CL11 and the second cells CL12. In the soft-programming operation, an Incremental Step Pulse Programming (ISPP) voltage of +5.5V to +9V is applied to the selected word line WL1, and a voltage of 0V is applied to the de-selected word lines WL0. The first cells CL11 and the second cells CL12 are soft programed by a plurality of shots each of which is for 5 microseconds (μs). The number of shots is lower than or equal to 8. For example, the first cells CL11 and the second cells CL12 may be sequentially programmed by eight shots which are +5.5V, +6V, +6.5V, +7V, +7.5V, +8V, +8.5V, +9V.

In another embodiment, ISPP biases in the step S130' may be set according to the following conditions: (1) A first ISPP bias suffered on the first cells CL11 to be programmed and a second ISPP bias suffered on the second cells CL12 to be erased are slightly lower than the program threshold voltage. The program threshold voltage is, for example, +20V, and the first ISPP bias and the second ISPP bias are, for example, +12.5V to +16V. (2) A third ISPP bias suffered on the cells CL0 is much lower than the program threshold voltage. For example, the third ISPP bias is, for example, +7V to 0V.

A negative voltage of −7V is applied to the first bit lines BL1, the first source lines SL1, the second bit lines BL2 and the second source lines SL2. Accordingly, the first cells CL11 to be programmed and the second cells CL12 to be erase are suffered a soft program bias from +12.5V to +16V.

Figure 10B:
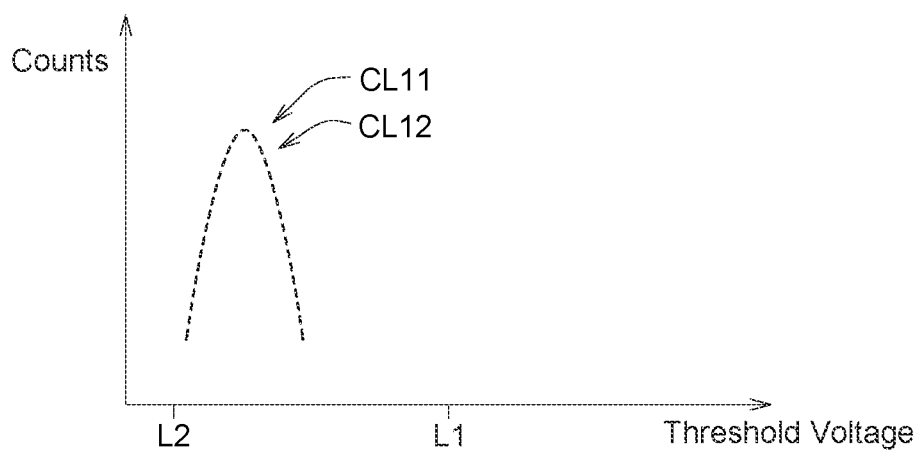
FIG. 10B illustrates a threshold voltage distribution in the step S130' of FIG. 8.

Refer to FIG. 10B, which illustrates a threshold voltage distribution in the step S130' of FIG. 3 according to one embodiment. After the soft-programming operation is performed on the first cells CL11 and the second cells CL12, the first cells CL11 and the second cells CL12 have the threshold voltage larger than the second predetermined level L2. Therefore, the threshold voltage distribution of the first cells CL11 and the second cells CL12 became tighter.

Figure 11A:
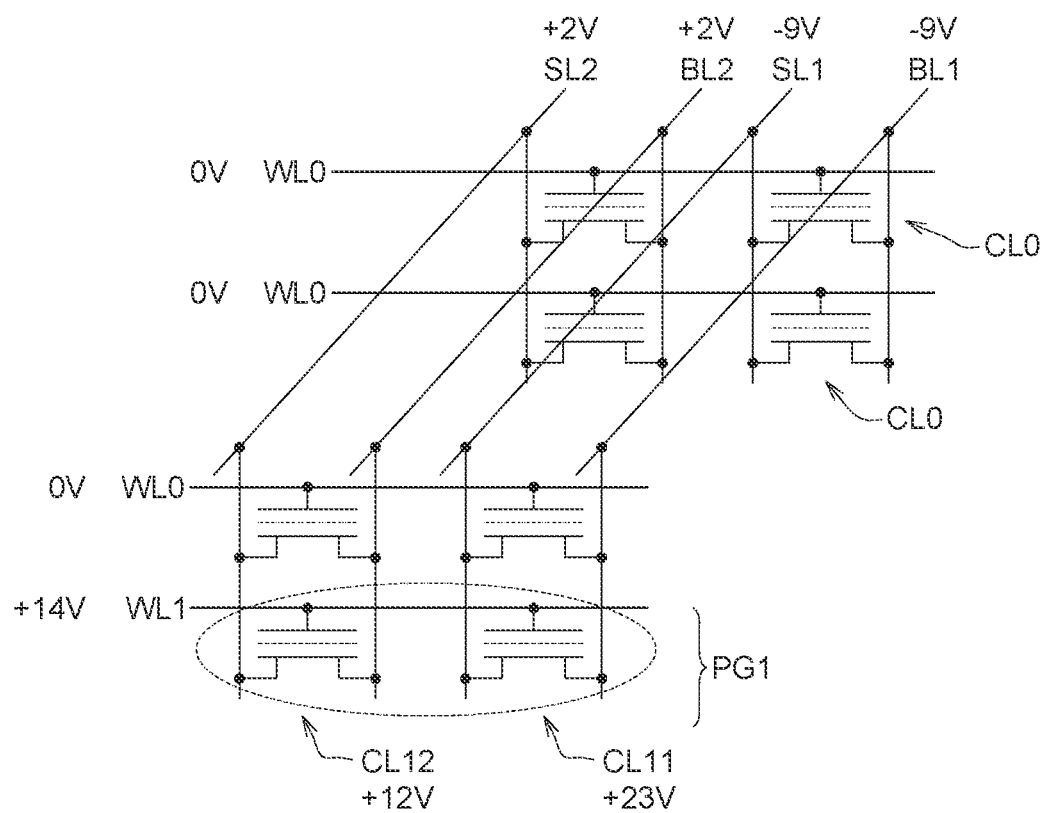
FIG. 11A illustrates a voltage control in the step S120 of FIG. 8.

Next, refer to FIG. 11A, which illustrates a voltage control in the step S120 of FIG. 8 according to one embodiment. In the step S120, a programming operation with a checkerboard pattern is performed on the selected word line WL1. The step S120 of performing the programming operation on the selected word line WL is performed by one shot for 10 microseconds (μs). A voltage of +14V is applied to the selected word line WL1, and a voltage of 0V is applied to the de-selected word lines WL0. A negative voltage of −9V is applied to the first bit lines BL1 and the first source lines SL1, a positive voltage of +2V is applied to the second bit lines BL2 and the second source lines SL2. Therefore, the first cells CL11 are suffered a first program bias of +23V and the second cells CL12 are suffered a second program bias of +12V. The second program bias is lower than the first program bias.

In another embodiment, program biases in the step S120 may be set according to the following conditions: (1) The first program bias suffered on the first cells CL11 to be programmed is larger than a program threshold voltage. The program threshold voltage is, for example, +20V, and the first program bias is, for example, +23V. (2) The second program bias suffered on the first cells CL12 to be erased is lower than the program threshold voltage. The second program bias, is for example, +12V. (3) A third program bias suffered on the cells CL0 connected to the de-selected word lines is much lower than the program threshold voltage. The third program bias is, for example, +9V to −2V.

Figure 11B:
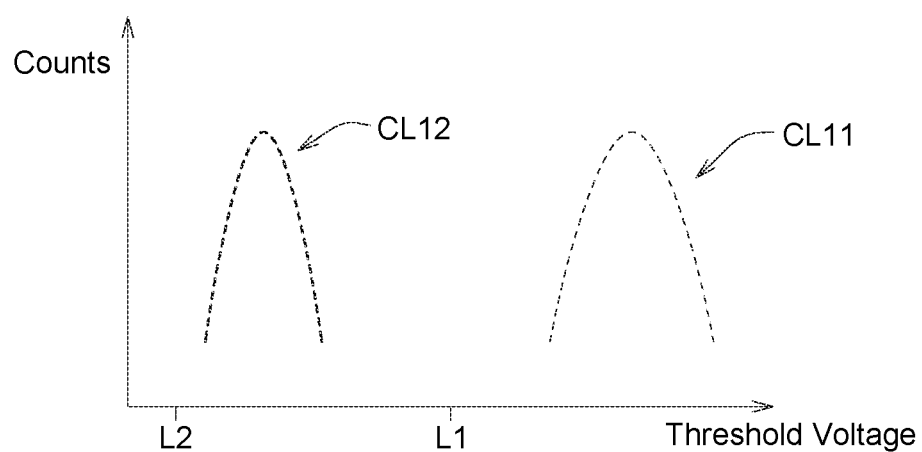
FIG. 11B illustrates a threshold voltage distribution in the step S120 of FIG. 8.

Refer to FIG. 11B, which illustrates a threshold voltage distribution in the step S120 of FIG. 3 according to one embodiment. After the programming operation with the checkerboard pattern is performed on the selected word line WL1, the threshold voltage of the first cells CL11 to be programmed is larger than that of the second cells CL12 to be erased.

Comparing with the FIG. 10B, the threshold voltage of the second cells CL12 in FIG. 11B shifts to the right due to the program disturbing and interference.

Base on above, the Write-in-Place operation in the memory device 100 can be successfully implemented. Only one page PG1 is needed to be erased and the same page PG1 can be programed. The user does not need to erase a block, and the write latency performance can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for performing an operation in a memory device, comprising:
performing an erasing operation on one selected word line of the memory device to ensure that a plurality of first cells to be programed and a plurality of second cells to be erased connected to the selected word line have threshold voltages lower than a first predetermined level; and
performing a programming operation after performing the erase operation on the selected word line, such that the first cells are suffered a first program bias and the second cells are suffered a second program bias which is lower than the first program bias.

2. The method according to claim 1, wherein in the step of performing the erasing operation on the selected word line, a first erase bias suffered on the first cells and a second erase bias suffered on the second cells are more negative than an erase threshold voltage.

3. The method according to claim 2, wherein the first erase bias suffered on the first cells and the second erase bias suffered on the second cells are substantially the same.

4. The method according to claim 1, wherein the step of performing the programming operation on the selected word line is performed form 100 microseconds (μs) to 1 milliseconds (ms).

5. The method according to claim 1, wherein in the step of performing the programming operation on the selected word line, the first program bias suffered on the first cells is larger than a program threshold voltage, and the second program bias suffered on the second cells is lower than the program threshold voltage.

6. The method according to claim 5, wherein in the step of performing the programming operation on the selected word line, a third program bias suffered on a plurality of cells connected to a plurality of de-selected word lines is lower than the program threshold voltage.

7. The method according to claim 1, wherein in the step of performing the programming operation on the selected word line, a negative voltage is applied to a plurality of first bit lines and a plurality of first source lines, a positive voltage is applied to a plurality of second bit lines and a plurality of second source lines, the first bit lines and the first source lines are connected to the first cells, and the second bit lines and the second source lines are connected to the second cells.

8. The method according to claim 1, wherein in the step of performing the programming operation on the selected word line, a voltage applied to the selected word line is larger than a voltage applied to a plurality of de-selected word lines.

9. The method according to claim 1, wherein the step of performing the programming operation on the selected word line is performed by one shot for 10 microseconds (μs).

10. The method according to claim 1, further comprising:
performing a soft-programming operation on the second cells to ensure that the second cells have the threshold voltage larger than a second predetermined level.

11. The method according to claim 10, wherein the second predetermined level is lower than the first predetermined level.

12. The method according to claim 10, wherein in the step of performing the soft-programming operation on the second cells, a first Incremental Step Pulse Programming (ISPP) voltage bias suffered on the first cells to be programed is lower than a program threshold voltage.

13. The method according to claim 12, wherein in the step of performing the soft-programming operation on the second cells, a second ISPP bias suffered on the second cells to be erased is lower than the program threshold voltage.

14. The method according to claim 13, wherein in the step of performing the soft-programming operation on the second cells, a third ISPP bias suffered on a plurality of cells connected to a plurality of de-selected word lines is lower than the program threshold voltage.

15. The method according to claim 10, wherein in the step of performing the soft-programming operation on the second cells, the second cells are soft programed by a plurality of shots and the number of the shots is lower than or equal to 8.

16. The method according to claim 10, wherein the step of performing the soft-programming operation on the second cells is performed after the step of performing the programming operation on the selected word line.

17. The method according to claim 1, further comprising:
performing a soft-programming operation on the first cells and the second cells to ensure that the first cells and the second cells have the threshold voltage larger than a second predetermined level.

18. The method according to claim 17, wherein the step of performing the soft-programming operation on the first cells and the second cells is performed before the step of performing the programming operation on the selected word line.

19. The method according to claim 18, wherein in the step of performing the soft-programming operation on the first cells and the second cells, a first soft-programming bias suffered on the first cells and a second soft-programming bias suffered on the second cells are lower than a program threshold voltage.

20. The method according to claim 19, wherein in the step of performing the soft-programming operation on the first cells and the second cells, the first soft-programming bias and the second soft programming bias are substantially the same.

* * * * *